US007906376B2

(12) United States Patent
Swaminathan

(10) Patent No.: US 7,906,376 B2
(45) Date of Patent: Mar. 15, 2011

(54) MAGNETIC PARTICLE-BASED COMPOSITE MATERIALS FOR SEMICONDUCTOR PACKAGES

(75) Inventor: Rajasekaran Swaminathan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 12/164,996

(22) Filed: Jun. 30, 2008

(65) Prior Publication Data
US 2009/0321923 A1 Dec. 31, 2009

(51) Int. Cl.
*H01L 21/00* (2006.01)
(52) U.S. Cl. ......... 438/122; 257/E23.101; 257/704; 257/706; 438/108; 438/125
(58) Field of Classification Search .......... 257/E21.001, 257/E23.08, 706, 707, 703, 704, 712, 737, 257/738, 778, E23.101, E23.105; 438/118, 438/122, 108, 125
See application file for complete search history.

(56) References Cited

U.S. PATENT DOCUMENTS

| | | | | |
|---|---|---|---|---|
| 5,311,059 A * | 5/1994 | Banerji et al. | ........... | 257/778 |
| 5,561,265 A * | 10/1996 | Livshits et al. | ........... | 174/386 |
| 5,639,989 A * | 6/1997 | Higgins, III | ........... | 174/386 |
| 5,909,057 A * | 6/1999 | McCormick et al. | ........... | 257/704 |
| 6,188,578 B1 * | 2/2001 | Lin et al. | ........... | 361/717 |
| 6,191,360 B1 * | 2/2001 | Tao et al. | ........... | 174/522 |
| 6,255,140 B1 * | 7/2001 | Wang | ........... | 438/122 |
| 6,388,273 B1 * | 5/2002 | Yamagata et al. | ........... | 257/77 |
| 6,433,412 B2 * | 8/2002 | Ando et al. | ........... | 257/678 |
| 6,538,319 B2 * | 3/2003 | Terui | ........... | 257/704 |
| 6,566,748 B1 * | 5/2003 | Shimizu et al. | ........... | 257/704 |
| 6,663,969 B2 * | 12/2003 | Masayuki et al. | ........... | 428/414 |
| 6,747,350 B1 * | 6/2004 | Lin et al. | ........... | 257/704 |
| 6,754,950 B2 * | 6/2004 | Furukawa et al. | ........... | 29/832 |
| 6,761,842 B2 * | 7/2004 | Tobita et al. | ........... | 264/435 |
| 6,784,541 B2 * | 8/2004 | Eguchi et al. | ........... | 257/723 |
| 6,794,223 B2 * | 9/2004 | Ma et al. | ........... | 438/122 |
| 6,876,075 B2 * | 4/2005 | Fukui | ........... | 257/712 |
| 6,952,050 B2 * | 10/2005 | Kwon et al. | ........... | 257/707 |
| 7,428,777 B2 * | 9/2008 | Cheng et al. | ........... | 29/825 |
| 7,489,015 B2 * | 2/2009 | Stobbs | ........... | 257/433 |
| 2004/0150118 A1 * | 8/2004 | Honda | ........... | 257/778 |

OTHER PUBLICATIONS

Auernhammer, Gunter K., et al., "Viscoelasticity of suspensions of magnetic particles in a polymer: Effect of confinement and external field," The Journal of Chemical Physics, vol. 124, 204907, (2006), 10 pgs.
Benicewicz, Brian C., et al., "Magnetic Field Orientation of Liquid Crystalline Epoxy Thermosets," American Chemical Society, Macromolecules, vol. 31, (1998), pp. 4730-4738.
Chae, B., et al., "Thermorheological behavior of magnetic dispersions," Journal of Rheology, vol. 45, Issue 5, (2001), pp. 1193-1203.

(Continued)

*Primary Examiner* — Chris Chu
(74) *Attorney, Agent, or Firm* — Blakely, Sokoloff, Taylor & Zafman LLP

(57) ABSTRACT

A semiconductor package is described. The semiconductor package includes a substrate and an integrated heat spreader disposed above and coupled with the substrate. A cavity is disposed between the substrate and the integrated heat spreader. A semiconductor die is disposed above the substrate and in the cavity. An array of first-level solder joints is disposed between the substrate and the semiconductor die. A layer of magnetic particle-based composite material is also disposed in the cavity.

20 Claims, 9 Drawing Sheets

OTHER PUBLICATIONS

Harada, Miyuki, et al., "Thermomechanical Properties of Liquid-Crystalline Epoxy Networks Arranged by a Magnetic Field," Journal of Polymer Science: Part B: Polymer Physics, vol. 42, (2004), pp. 758-765.

Koerner, Hilmar, et al., "Generating Triaxial Reinforced Epoxy/Montmorillonite Nanocomposites with Uniaxial Magnetic Fields," American Chemical Society, Chem. Mater., vol. 17, (2005), pp. 1990-1996.

Otaigbe, Ju, et al., "Effect of coupling agent and filler particle size on melt rheology of polymer-bonded Md-Fe-B magnets," Polymer Composites, vol. 20, Issue 5, (1999), pp. 697-704.

Suwanwatana, W., et al., "Influence of particle size on hysteresis heating behavior of nickel particulate polymer films," Elsevier, ScienceDirect, Composites Science and Technology, vol. 66, (2006), pp. 2825-2836.

Varga, Zsolt, et al., "Magnetic field sensitive functional elastomers with tuneable elastic modulus," Elsevier, ScienceDirect, Polymer, vol. 47, (2006), pp. 227-233.

Wong, John Erik, et al., "Layer-by-layer assembly of a magnetic nanoparticle shell on a thermoresponsive microgel core," Elsevier, ScienceDirect, Journal of Magnetism and Magnetic Materials, vol. 311, (2007), pp. 219-223.

Zhao, Dong-Lin, et al., "$Fe_3O_4$/polyaniline Nanoparticles with Core-shell Structure and Their Inductive Heating Property in AC Magnetic Field," Key Engineering Materials, vols. 334-335 (2007) pp. 1189-1192.

\* cited by examiner

US 7,906,376 B2

MAGNETIC PARTICLE-BASED COMPOSITE MATERIALS FOR SEMICONDUCTOR PACKAGES

TECHNICAL FIELD

Embodiments of the invention are in the field of semiconductor packages and, in particular, composite materials for semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. The need for ever more sophisticated packaging for such a semiconductor die, or groups of semiconductor dice, has paralleled the scaling, increasing the technological demands on semiconductor packages which house such semiconductor die or groups of semiconductor dice.

Implementing thin core/coreless substrates within the framework of a current electronic packaging assembly process (e.g., a process involving bulk heating and cooling of the semiconductor package) without significant yield loss is a big challenge. For example, the yield loss may be due to issues associated with package warpage, which is significantly modulated during any polymer curing (including underfill) process. Currently, the underfill curing process requires subjection of an entire package to a thermal cycling, which can exacerbate the overall warpage of the package.

In another example, polymer shrinkage that arises as a result of subjecting a polymer composite to a thermal cycle during the curing of the polymer leads to reliability concerns such as delamination and cracking at different interfaces associated with an underfill or polymer thermal interface material (PTIM) within a semiconductor package. Currently, there is no predictable way to control the cure kinetics of such a composite system.

Furthermore, current polymer composite formulations have temperature dependent viscosity, which makes it difficult to tailor the viscosity for improved pot life along with improved flow during dispense. An ideal system could have the same viscosity at storage temperatures and at the dispense temperature, which would aid with tailoring polymer composite materials for use in electronic packaging. One approach to reducing viscosity of the underfill has been to reduce the filler content. However, this approach negatively impacts the mechanical properties of the underfill material, including undesirably impacting the coefficient of thermal expansion (CTE) and the modulus of the underfill material.

DETAILED DESCRIPTION

Figure 1:
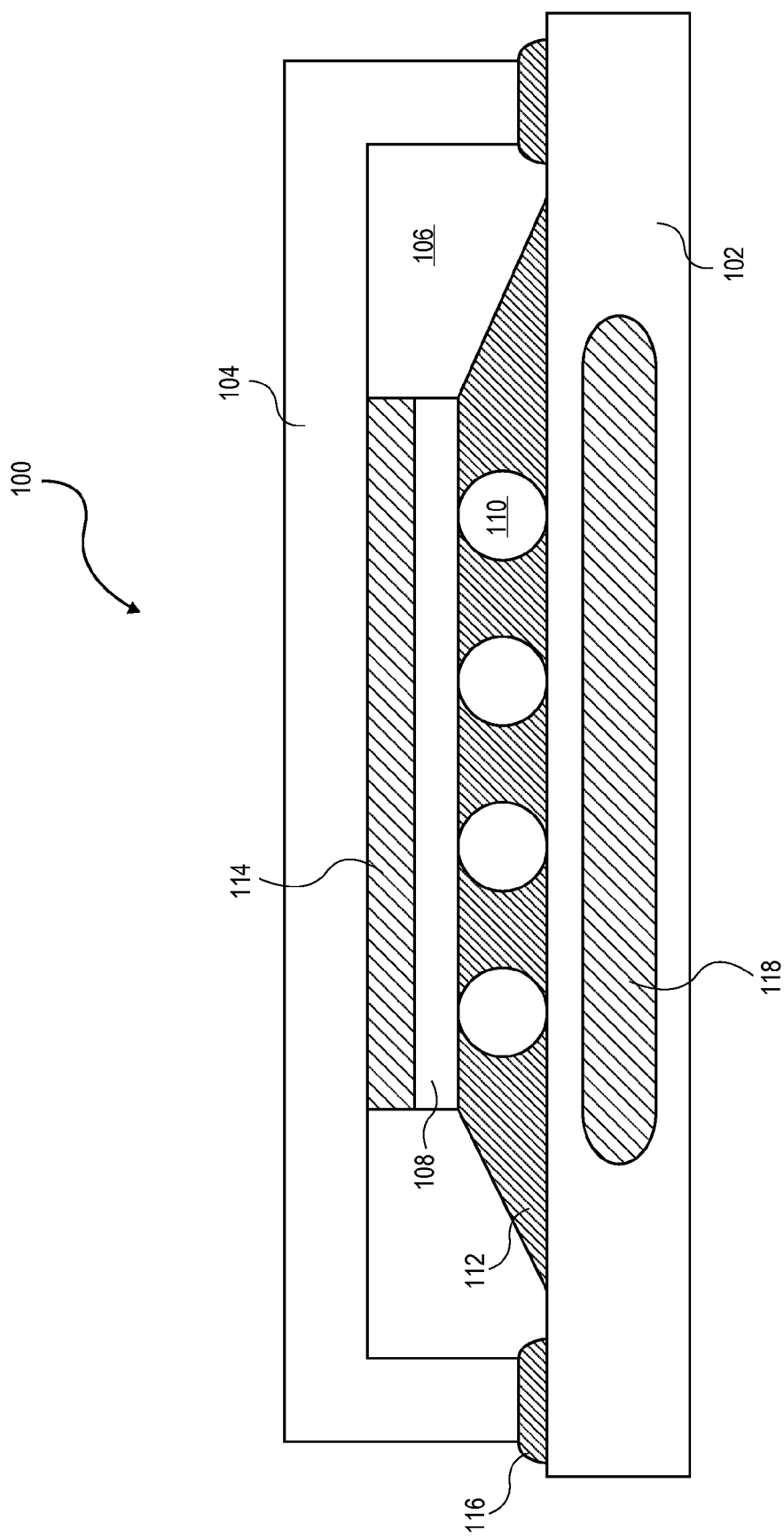
FIG. 1 illustrates a cross-sectional view of a semiconductor package including a layer of magnetic particle-based composite material, in accordance with an embodiment of the present invention.

Magnetic particle-based composite materials for semiconductor packages are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Disclosed herein are semiconductor packages that include magnetic particle-based composite materials. A semiconductor package may include a substrate and an integrated heat spreader disposed above and coupled with the substrate. In one embodiment, a cavity is disposed between the substrate and the integrated heat spreader, and a semiconductor die is disposed above the substrate and in the cavity. An array of first-level solder joints may be disposed between the substrate and the semiconductor die, in the cavity. In one embodiment, a layer of magnetic particle-based composite material is also disposed in the cavity. A method of fabricating a semiconductor package may include providing a semiconductor die above a substrate. In one embodiment, a magnetic particle-based composite material is flowed to form a layer of magnetic particle-based composite material along a surface of the semiconductor die. In an embodiment, a magnetic particle-based composite material is flowed to form a layer of magnetic particle-based composite material along a surface of the semiconductor die by applying an external direct current (DC) magnetic field to the magnetic particle-based composite material. In another embodiment, a method of fabricating a semiconductor package includes curing a layer of magnetic particle-based composite material by applying an external alternating current (AC) magnetic field to the magnetic particle-based composite material.

A layer of magnetic particle-based composite material may be incorporated into a semiconductor package. In accordance with an embodiment of the present invention, magnetic particles are used to replace a portion of traditional filler particles, e.g. silica particles, in a composite used in a semiconductor package. In one embodiment, introduction of a layer of magnetic particle-based composite material into a semiconductor package provides for the ability to "tune" the thermal cure behavior of the layer of magnetic particle-based composite material with the use of an externally applied AC magnetic field. In another embodiment, even in the absence of the applied AC magnetic field, stand-alone magnetic particles are used as fillers in a composite material to provide for decreased viscosity of the composite material present in a semiconductor package. Such decreased viscosity improves flow behavior of the composite material which can reduce flow times and keep out zones. In one embodiment, a decreased viscosity increases storage and loss modulus and glass transition temperature, improving the mechanical properties of the polymer composite for compatibility with a semiconductor package. In an embodiment, the viscosity of a layer of magnetic particle-based composite material is manipulated by applying a DC magnetic field.

In an embodiment of the present invention, a semiconductor package includes a layer of magnetic particle-based composite material. FIG. 1 illustrates a cross-sectional view of a semiconductor package 100 including a layer of magnetic particle-based composite material, in accordance with an embodiment of the present invention.

Referring to FIG. 1, semiconductor package 100 includes a substrate 102 and an integrated heat spreader 104 disposed above and coupled with substrate 102. A cavity 106 is disposed between substrate 102 and integrated heat spreader 104. A semiconductor die 108 is disposed above substrate 102 and in cavity 106. An array of first-level solder joints 110 is disposed between substrate 102 and semiconductor die 108. In accordance with an embodiment of the present invention, semiconductor package 100 includes a layer of magnetic particle-based composite material disposed in cavity 106. In one embodiment, the layer of magnetic particle-based composite material is disposed between substrate 102 and semiconductor die 108 to encapsulate the array of first-level solder joints 110, i.e. to form an underfill layer 112, as depicted in FIG. 1. In another embodiment, the layer of magnetic particle-based composite material is disposed between semiconductor die 108 and integrated heat spreader 104 to bond semiconductor die 108 to integrated heat spreader 104, i.e. to form a thermal interface material 114, as depicted in FIG. 1. In accordance with another embodiment of the present invention, the layer of magnetic particle-based composite material is disposed outside of cavity 106. In one embodiment, the layer of magnetic particle-based composite material is disposed at the locations where integrated heat spreader 104 meet substrate 102, i.e. to form a sealant 116, as depicted in FIG. 1. In another embodiment, the layer of magnetic particle-based composite material is disposed in the core of substrate 102, i.e. to form a magnetic substrate core 118, as depicted in FIG. 1. It is to be understood that a layer of magnetic particle-based composite material may be disposed at more than one location in a semiconductor package. For example, in accordance with an embodiment of the present invention, a layer of magnetic particle-based composite material is disposed in at least two locations within a semiconductor package, the locations selected from locations such as, but not limited to, between substrate 102 and semiconductor die 108, between semiconductor die 108 and integrated heat spreader 104, at the locations where integrated heat spreader 104 meet substrate 102, or in the core of substrate 102.

The layer of magnetic particle-based composite material may be composed of a material that exhibits a measurable magnetic effect. In accordance with an embodiment of the present invention, the layer of magnetic particle-based composite material includes a polymeric matrix with an array of magnetic particles dispersed therein. The magnetic particles may substitute or partially substitute non-magnetic particles, such as silica particles, in a conventional composite material used for semiconductor packages. For example, in one embodiment, the polymeric matrix further includes an array of non-magnetic particles, where the ratio of the array of magnetic particles to the array of non-magnetic particles is approximately 1:9. In an embodiment, the array of magnetic particles includes metal particles such as, but not limited to, iron (Fe), Cobalt (Co), Nickel (Ni), or alloys thereof. In another embodiment, the array of magnetic particles includes metal oxide particles of a formula such as, but not limited to, $MFe_2O_4$ or $MFe_{12}O_{19}$, where M is a metal such as, but not limited to, iron (Fe), Cobalt (Co), or Nickel (Ni). In an embodiment, the polymeric matrix used to house the magnetic particles is composed of an epoxy resin.

Figure 2:
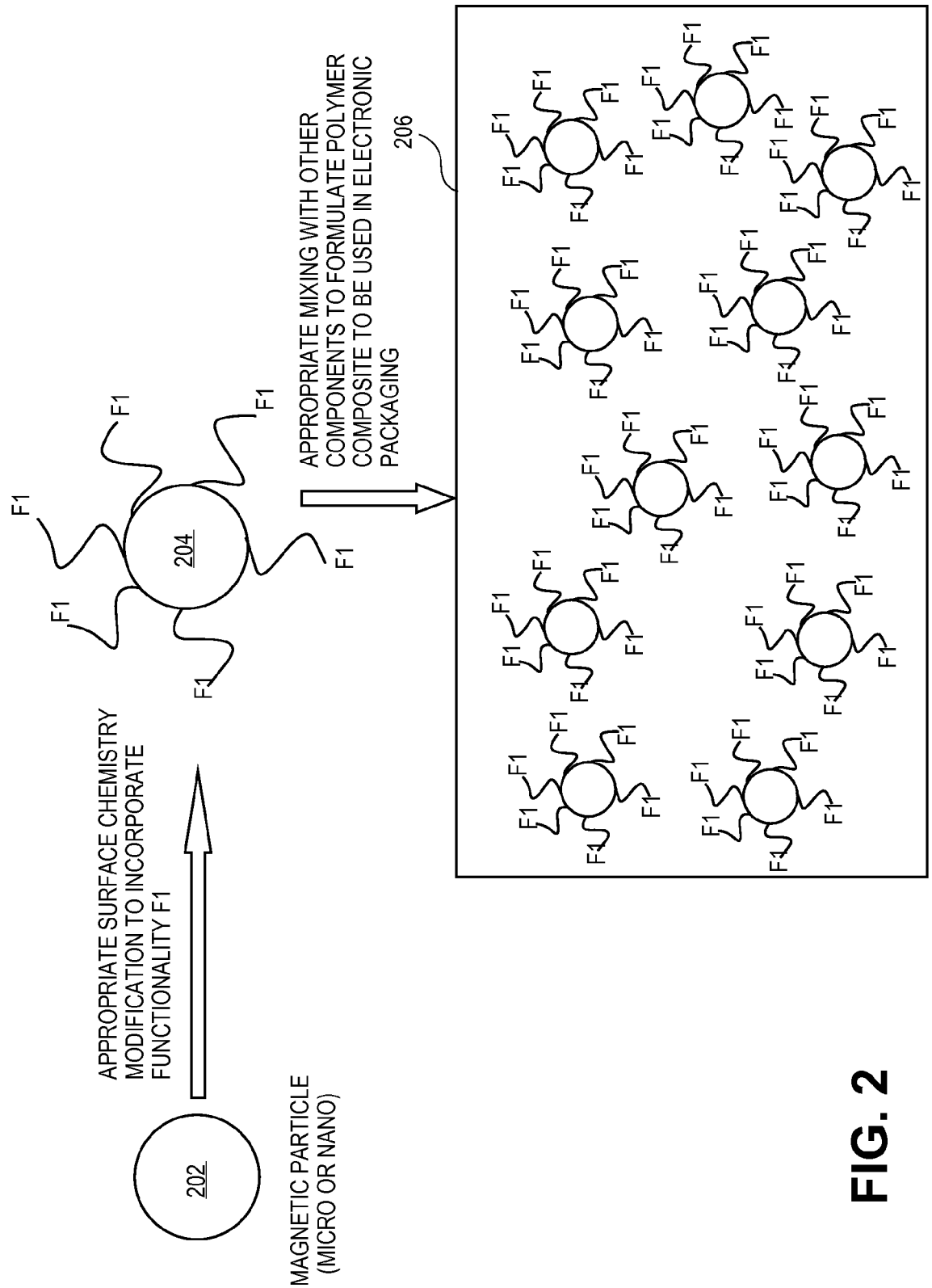
FIG. 2 illustrates the functionalization of a magnetic particle prior to its incorporation into a polymeric matrix, in accordance with an embodiment of the present invention.

The layer of magnetic particle-based composite material may include magnetic particles that have been functionalized prior to their incorporation into a polymeric matrix. FIG. 2 illustrates the functionalization of a magnetic particle prior to its incorporation into a polymeric matrix, in accordance with an embodiment of the present invention. Referring to FIG. 2, a magnetic particle 202 is treated with an appropriate surface chemistry modification to incorporate functional chemical groups, F1, onto magnetic particle 202 to form functionalized magnetic particle 204. In one embodiment, magnetic particle 202 has dimensions on the micro- or nano-scale. In an embodiment, magnetic particle 202 is treated with a surfactant to form functionalized magnetic particle 204. Referring again to FIG. 2, an array of functionalized magnetic particles 204 are dispersed in a polymer matrix 206 to form a functionalized magnetic particle-based composite material. In accordance with an embodiment of the present invention, the functionalized magnetic particle-based composite material is used to form a layer of magnetic particle-based composite material as an interface material in a semiconductor package.

Semiconductor die 108 may be an individual semiconductor chip used in the electronics industry. In one embodiment, semiconductor die 108 is a microprocessor formed on a slice of mono-crystalline silicon. In another embodiment, semiconductor die 108 is a diode formed on a III-V material slice. Semiconductor die 108 may represent a platform of several units housed together, e.g., in one embodiment, semiconductor package 100 houses a multi-chip module. Semiconductor die 108 may have a surface having a micro-electronic integrated circuit formed thereon. In one embodiment, semiconductor die 108 has a surface including an array of CMOS transistors connected through a series of metal interconnects. In an embodiment, semiconductor die 108 has a thickness approximately in the range of 350-800 microns.

Integrated heat spreader 104 may be composed of a material or set of materials suitable for displacing heat from the surface of semiconductor die 108. In one embodiment, integrated heat spreader 104 is composed of a copper base plated with nickel metal. Substrate 102 may be composed of a material suitable for supporting semiconductor die 108 in semiconductor package 100. In one embodiment, substrate 102 is composed of a material having a coefficient of thermal expansion (CTE) different from the CTE of integrated heat spreader 104. The array of first-level solder joints 110 may be composed of a material or materials suitable to provide a low resistance communication pathway between devices on semiconductor die 108 and any traces incorporated into substrate 102. In one embodiment, the array of first-level solder joints 110 is composed of a metal such as, but not limited to, copper, silver, or lead.

Figure 3:
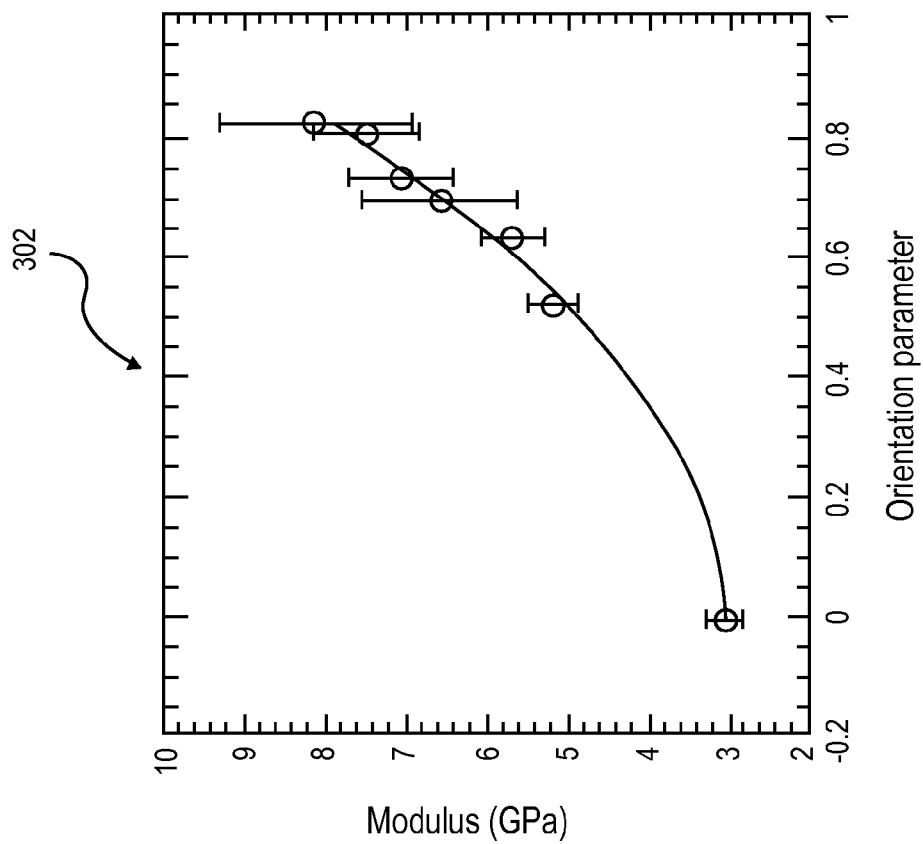
FIG. 3 includes plots showing that the coefficient of thermal expansion (CTE) and the modulus (E) of a layer of magnetic particle-based composite material is independently varied by an applied direct current (DC) magnetic field, as a function of an orientation parameter, in accordance with an embodiment of the present invention.
Figure 3:
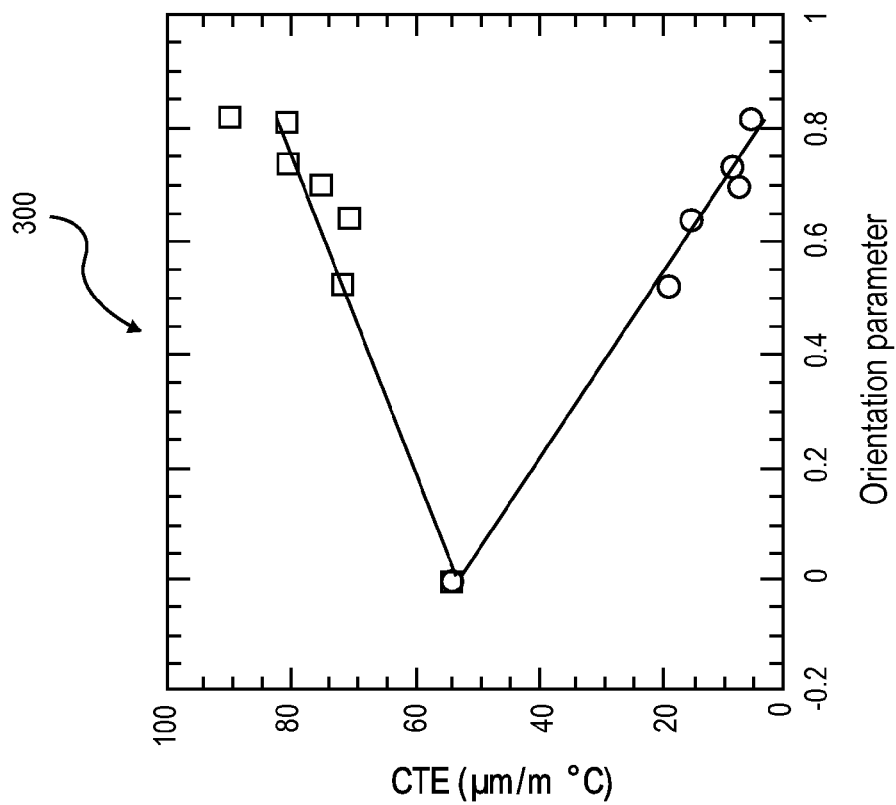

In an embodiment of the present invention, a DC magnetic field is applied during the flowing of a magnetic particle-based composite material to form a layer of magnetic particle-based composite material in a semiconductor package. DC magnetic fields may influence the flow and mechanical properties of a magnetic particle-based composite material. In one embodiment, the mechanical properties of the magnetic particle-based composite material that can modified with an externally applied DC magnetic field include, but are not limited to, the CTE and the modulus (E). FIG. 3 includes plots 300 and 302 showing that CTE and E, respectively, of a magnetic particle-based composite material is independently varied by an applied DC magnetic field, as a function of an orientation parameter, in accordance with an embodiment of the present invention. Referring to plot 300, the CTE of a layer of magnetic particle-based composite material parallel to the magnetic field direction decreases with increasing magnetic field, while the CTE of a layer of magnetic particle-based composite material perpendicular to the magnetic field direction increases with increasing magnetic field. Referring to plot 302, the modulus, E, of a layer of magnetic particle-based composite material increases quadratically as a function of orientation parameter, and is not dependent on the direction of the applied field. Thus, in accordance with an embodiment of the present invention, the CTE and the modulus of a magnetic particle-based composite material is tuned independently of one another in a semiconductor package.

Figure 4:
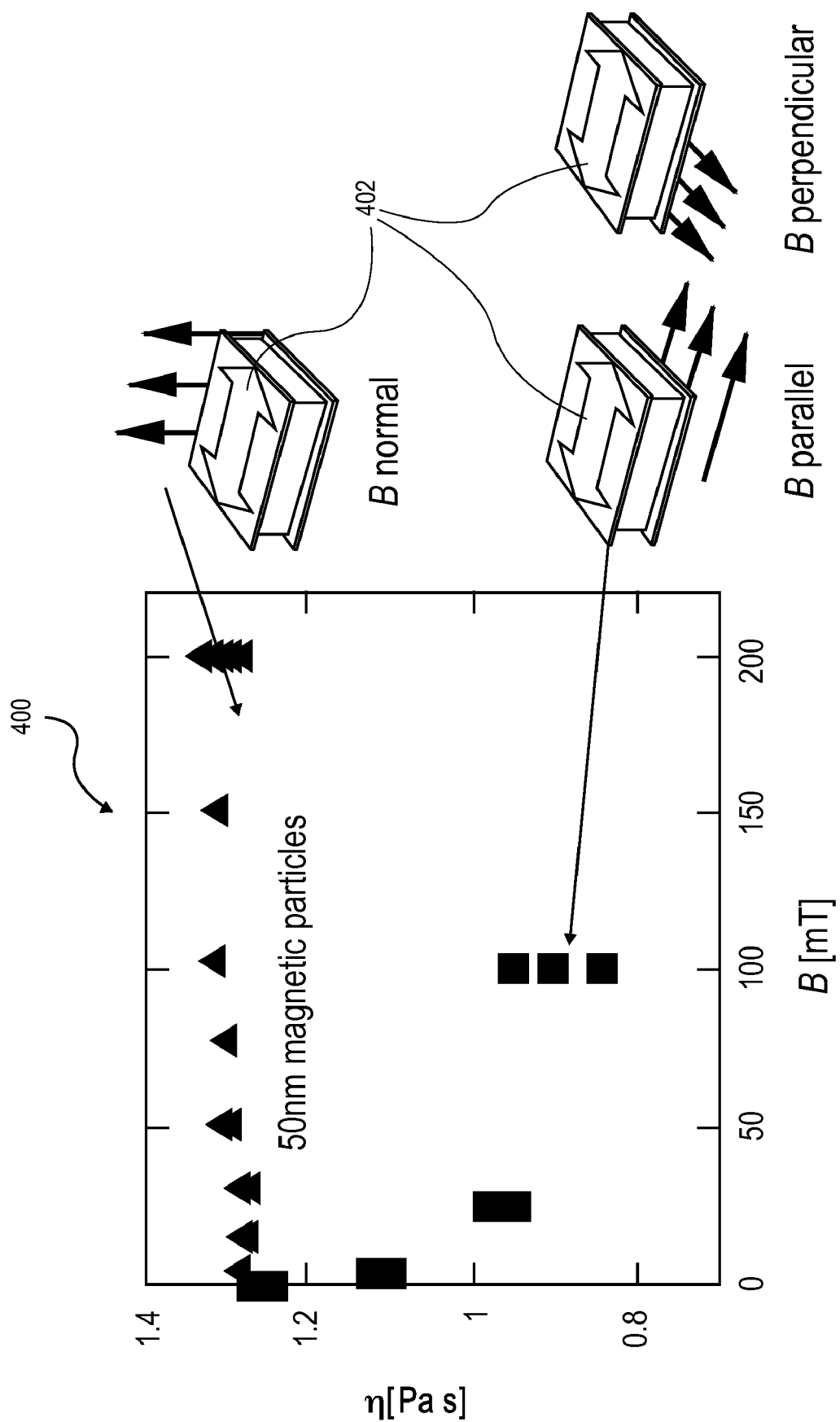
FIG. 4 is a plot showing the dependence of viscosity of a layer of magnetic particle-based composite material on an applied direct current (DC) magnetic field, in accordance with an embodiment of the present invention.

Magnetic particles may be used as a tunable source of repulsion between colloidal particles in a magnetic particle-based composite material. In accordance with an embodiment of the present invention, in the presence of an applied magnetic field, viscosity is strongly dependent on the direction of the applied magnetic field during flowing. FIG. 4 is a plot 400 showing the dependence of viscosity of a layer of magnetic particle-based composite material on an applied DC magnetic field, in accordance with an embodiment of the present invention. Referring to plot 400, in one embodiment, when a field is applied in the same plane as a shear direction 402 (i.e. B perpendicular or B parallel), viscosity decreases significantly. Referring again to plot 400, in another embodiment, when a field is applied in a plane different from shear direction 402 (i.e. B normal), viscosity stays constant.

Figure 5:
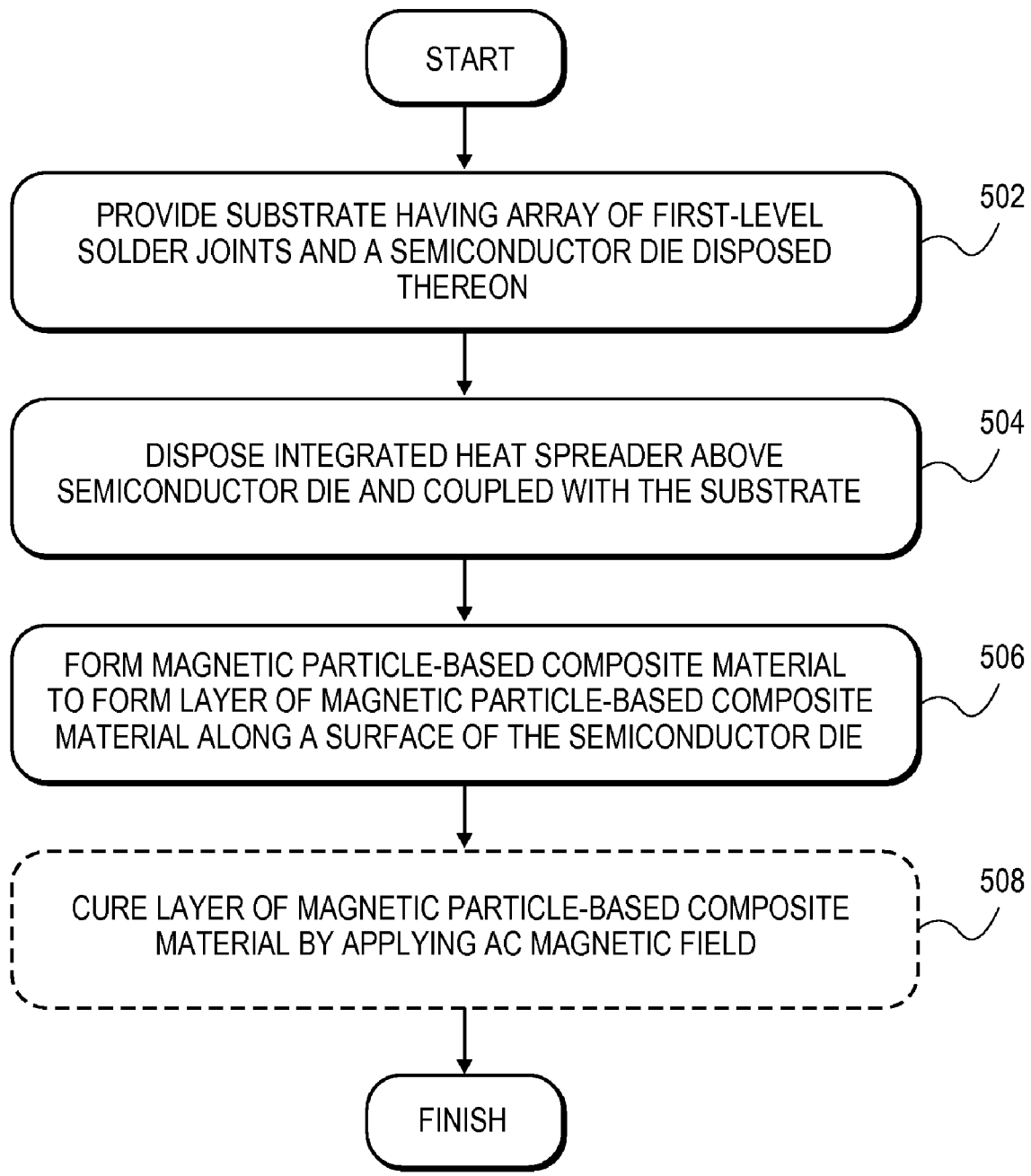
FIG. 5 is a Flowchart representing operations in a method for fabricating a semiconductor package including a layer of magnetic particle-based composite material, in accordance with an embodiment of the present invention.

In an embodiment of the present invention, the dependence of viscosity of a magnetic particle-based composite material is exploited to enable a void-free fill, such as an underfill, to form a void-free layer of magnetic particle-based composite material in a semiconductor package. FIG. 5 is a Flowchart 500 representing operations in a method for fabricating a semiconductor package including a layer of magnetic particle-based composite material, in accordance with an embodiment of the present invention.

Referring to operation 502 of Flowchart 500, a substrate is provided having an array of first-level solder joints and a semiconductor die disposed thereon. In one embodiment, the semiconductor die has a top surface and a bottom surface, wherein the bottom surface is adjacent to the array of first-level solder joints. The semiconductor die, the substrate and the array of first-level solder joints may be similar to semiconductor die 108, substrate 102 and the array of first-level solder joints 110, described in association with FIG. 1.

Referring to operation 504 of Flowchart 500, an integrated heat spreader is disposed above the top surface of the semiconductor die and coupled with the substrate. The heat spreader may be similar to heat spreader 104, described in association with FIG. 1. In accordance with an embodiment of the present invention, the heat spreader is coupled with the substrate by a layer of magnetic particle-based composite material acting as a sealant.

Referring to operation 506 of Flowchart 500, a magnetic particle-based composite material is flowed to form a layer of magnetic particle-based composite material along a surface of the semiconductor die. In accordance with an embodiment of the present invention, flowing the magnetic particle-based composite material includes applying an external DC magnetic field to the magnetic particle-based composite material. In one embodiment, the layer of magnetic particle-based composite material is formed along the bottom surface of the semiconductor die to encapsulate the array of first-level solder joints. In another embodiment, the layer of magnetic particle-based composite material is formed along the top surface of the semiconductor die to bond the semiconductor die with the integrated heat spreader. In an embodiment, the use of a layer of magnetic particle-based composite material in an underfill process which includes applying a DC magnetic field aids in the elimination of defects such as, but not limited to, underfill delamination, edge delamination, or die cracking.

Subsequent to flowing the magnetic particle-based composite material, the resulting layer of magnetic particle-based composite material formed may be subjected to a curing process. In accordance with an embodiment of the present invention, the curing process is based on an AC magnetic field cure process, described in detail below, as opposed to a thermal cycling process. Thus, in one embodiment, referring to operation 508 of Flowchart 500, the above method further includes curing the layer of magnetic particle-based composite material by applying an external AC magnetic field to the already-flowed magnetic particle-based composite material. In an embodiment, the layer of magnetic particle-based composite material is cured by applying an external AC magnetic field with a frequency, $R_F$, approximately in the range of 100-1000 kHz.

In an embodiment of the present invention, a magnetic particle-filled polymer composite is used in conjunction with a processing method involving the application of AC magnetic fields during the curing of the polymer composite. For example, in one embodiment, a layer of magnetic particle-based composite material exhibits an increased glass transition temperature along with increased loss and storage modulus, which may be beneficial for a first-level interconnect failure mode typically associated with the mechanical properties of the underfill material. Magnetic field based curing is different from traditional curing mechanisms, since effective magnetic field strength during the cure does not decrease in the center of the sample. This is not typically the case with traditional thermal curing in conventional ovens, which can lead to inhomogeneity during the cure and, ultimately, lead to significant shrinkage of a semiconductor package housing the cured material. The driving force for the mechanical property enhancement during magnetic field processing that occurs in polymeric systems may be the orientation of an organic molecule with respect to a magnetic field. In one embodiment, the orientation results from the diamagnetic susceptibility of the polymeric chains in an organic molecule. In polymeric systems, molecular motions are cooperative and, hence, orientation energy is increased relative to the thermal energy in the system. In an embodiment, this leads to an oriented cure in which the polymer chains are oriented in the direction of the applied magnetic field, resulting in increased anisotropy.

In accordance with an embodiment of the present invention, a magnetic particle-filled polymer composite cured by using AC magnetic fields undergo a localized heating with high ramp rates, i.e. the magnetic particle-filled polymer composite undergoes induction heating. Curing using induction heating may be a very energy efficient process, with thermal efficiencies of up to 95%, compared to thermal efficiencies of 40% in a conventional global heating curing process. In one embodiment, induction heating requires no warm-up or cool-down cycle and heat losses are therefore are minimized considerably. In an embodiment, the induction heating provides for site-specific, i.e. localized, heat delivery to very small areas of a semiconductor package, without heating any surrounding components. In an embodiment, the localized heating has a heat rate approximately in the range of 50-60 degrees Celsius for an applied magnetic field having a strength of approximately 0.05 Tesla and a frequency approximately in the range of 2-5 MHz.

Figure 6:
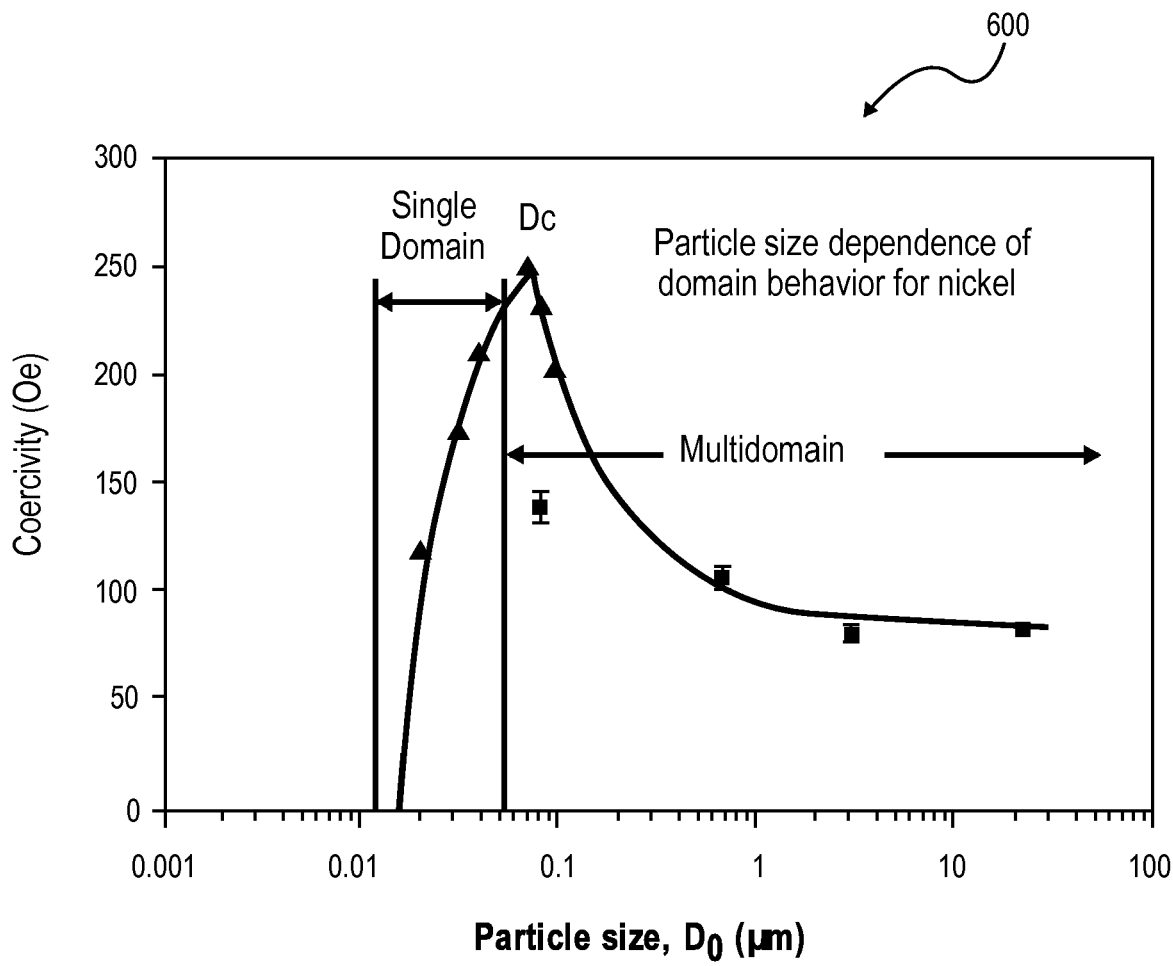
FIG. 6 is a plot of coercivity as a function of particle size for magnetic particles included in a layer of magnetic particle-based composite material, in accordance with an embodiment of the present invention.

Thus, magnetic particles may be used as point heat sources for curing a layer of magnetic particle-based composite material. In one embodiment, magnetic particles included in a polymer matrix generate heat in the presence of AC magnetic fields (by relaxational and hysteretic modes) through induction heating. The principle of induction heating using hysteresis relies on the energy released (equivalent to the amount of heat that is generated) in a single magnetic cycle, which is given by Equation 1, $$W_h = 4 M_s H_c \quad \text{(Eq. 1)}$$

where $M_s$ is the saturation magnetization and $H_c$ is the coercive force. The overall heat power is given by Equation 2, $$P_{hy} = f \times W_h = 4 f M_s H_c \quad \text{(Eq. 2)}$$

where f is the frequency of the applied magnetic field. Magnetic particles in solution (or colloid form) can also generate heat by the principle of relaxation, which involves two modes of motion of the magnetic particle. The modes include the Neel motion (activation against crystal anisotropy barrier, which depends on magnetic anisotropy and particle volume) and Brownian motion (activation by thermal energy against inner rotational viscosity in dispersion, which depends on hydrodynamic volume). In an embodiment, the overall heat generation of magnetic particles in a layer of magnetic particle-based composite material driven by an induction heating mechanism depends on factors such as, but not limited to, the saturation magnetization and coercivity (determined by the magnetic particle size), heat capacity, density, volume fraction, particle size of the filler particles, the applied magnetic field and frequency, or temperature. For example, in an embodiment, the parametric heat generation of nickel particles in a polymer composite at 2.25 MHz ($Q_p$ scales linearly with frequency) is given by Equation 3, $$Q_P(D_{Ni}) = 1.16 \times 10^{-5} \left(\frac{D_{Ni}}{D_c}\right)^{-0.42} H^{\left[0.073 \ln \frac{D_{Ni}}{D_c} + 3.4\right]} \quad \text{(Eq. 3)}$$

where $D_{Ni}$ is the particle size and $D_c$ is the single domain critical diameter of Ni. The single domain particle size is an intrinsic material property, while the $D_{Ni}$ is tailored by processing. FIG. 6 is a plot 600 of coercivity as a function of particle size for magnetic particles included in a layer of magnetic particle-based composite material, in accordance with an embodiment of the present invention. Referring to plot 600 of FIG. 6, the single domain particle sizes for different magnetic materials are very low (~10-100 nm) and, by tailoring the $D_{Ni}$ appropriately, a significant amount of heat is generated. For example in an embodiment, the particle heat generation for an array of approximately 79 nanometer diameter nickel particles with an approximate 10 weight percent loading in a polysulfone matrix is about 50 J/m³ with an applied external magnetic field of approximately 77 Oe, and is about 400 J/m³ with an applied external magnetic field of approximately 160 Oe. Furthermore, referring again to plot 600, the heat generation decreases as the particle size ($D_{Ni}$) increases. In accordance with an embodiment of the present invention, the heating behavior in a polymer composite is regulated for, e.g., a curing process by tailoring the particle size and volume fraction of the magnetic particles in the polymer composite along with the applied field and frequency of the applied field.

Figure 7:
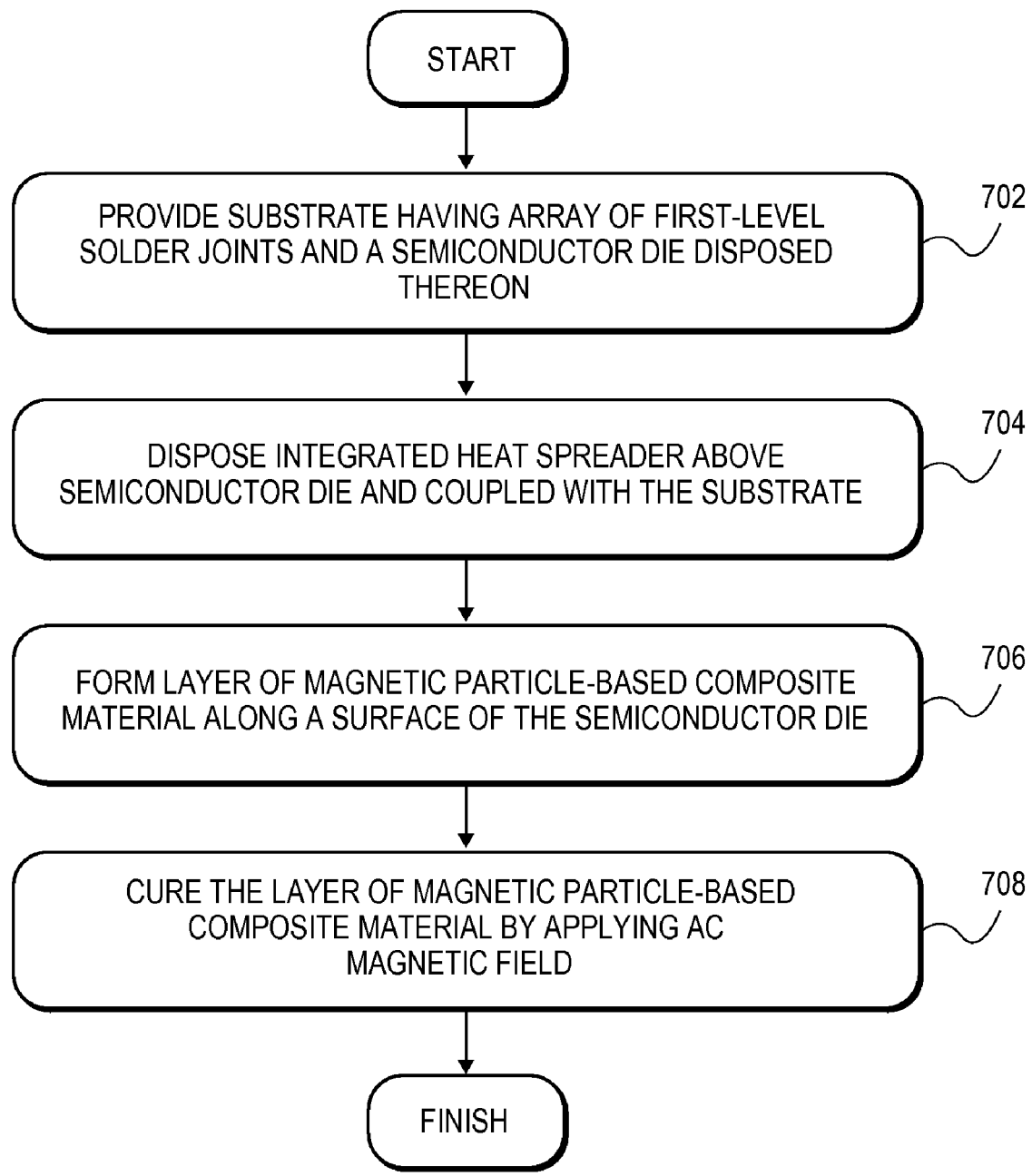
FIG. 7 is a Flowchart representing operations in a method for fabricating a semiconductor package including a layer of magnetic particle-based composite material, in accordance with an embodiment of the present invention.

In an embodiment of the present invention, the dependence of curability on an applied DC magnetic field is exploited to enable a thermal-cycling-free cure of an interface material in a semiconductor package. FIG. 7 is a Flowchart 700 representing operations in a method for fabricating a semiconductor package including a layer of magnetic particle-based composite material, in accordance with an embodiment of the present invention.

Referring to operation 702 of Flowchart 700, a substrate is provided having an array of first-level solder joints and a semiconductor die disposed thereon. In one embodiment, the semiconductor die has a top surface and a bottom surface, wherein the bottom surface is adjacent to the array of first-level solder joints. The semiconductor die, the substrate and the array of first-level solder joints may be similar to semiconductor die 108, substrate 102 and the array of first-level solder joints 110, described in association with FIG. 1.

Referring to operation 704 of Flowchart 700, an integrated heat spreader is disposed above the top surface of the semiconductor die and coupled with the substrate. The heat spreader may be similar to heat spreader 104, described in association with FIG. 1. In accordance with an embodiment of the present invention, the heat spreader is coupled with the substrate by a layer of magnetic particle-based composite material acting as a sealant.

Referring to operation 706 of Flowchart 700, a layer of magnetic particle-based composite material is formed along a surface of the semiconductor die. In one embodiment, the layer of magnetic particle-based composite material is formed along the bottom surface of the semiconductor die to encapsulate the array of first-level solder joints. In another embodiment, the layer of magnetic particle-based composite material is formed along the top surface of the semiconductor die to bond the semiconductor die with the integrated heat spreader.

Referring to operation 708 of Flowchart 700, the layer of magnetic particle-based composite material is cured by applying an external AC magnetic field to the magnetic particle-based composite material. In accordance with an embodiment of the present invention, the AC magnetic field has a frequency, $R_F$, approximately in the range of 100-1000 kHz. The curing process may also be accompanied by application of a DC magnetic field in order to modify the modulus of the cured layer of magnetic particle-based composite material. In one embodiment, the curing further includes applying an external DC magnetic field having a field strength of less than approximately 1 Tesla to the magnetic particle-based composite material. In that embodiment, the layer of magnetic particle-based composite material is a low modulus film following the curing. In another embodiment, the curing further includes applying an external DC magnetic field having a field strength of greater than approximately 1 Tesla to the magnetic particle-based composite material. In that embodiment, the layer of magnetic particle-based composite material is a high modulus film following the curing.

Figure 8:
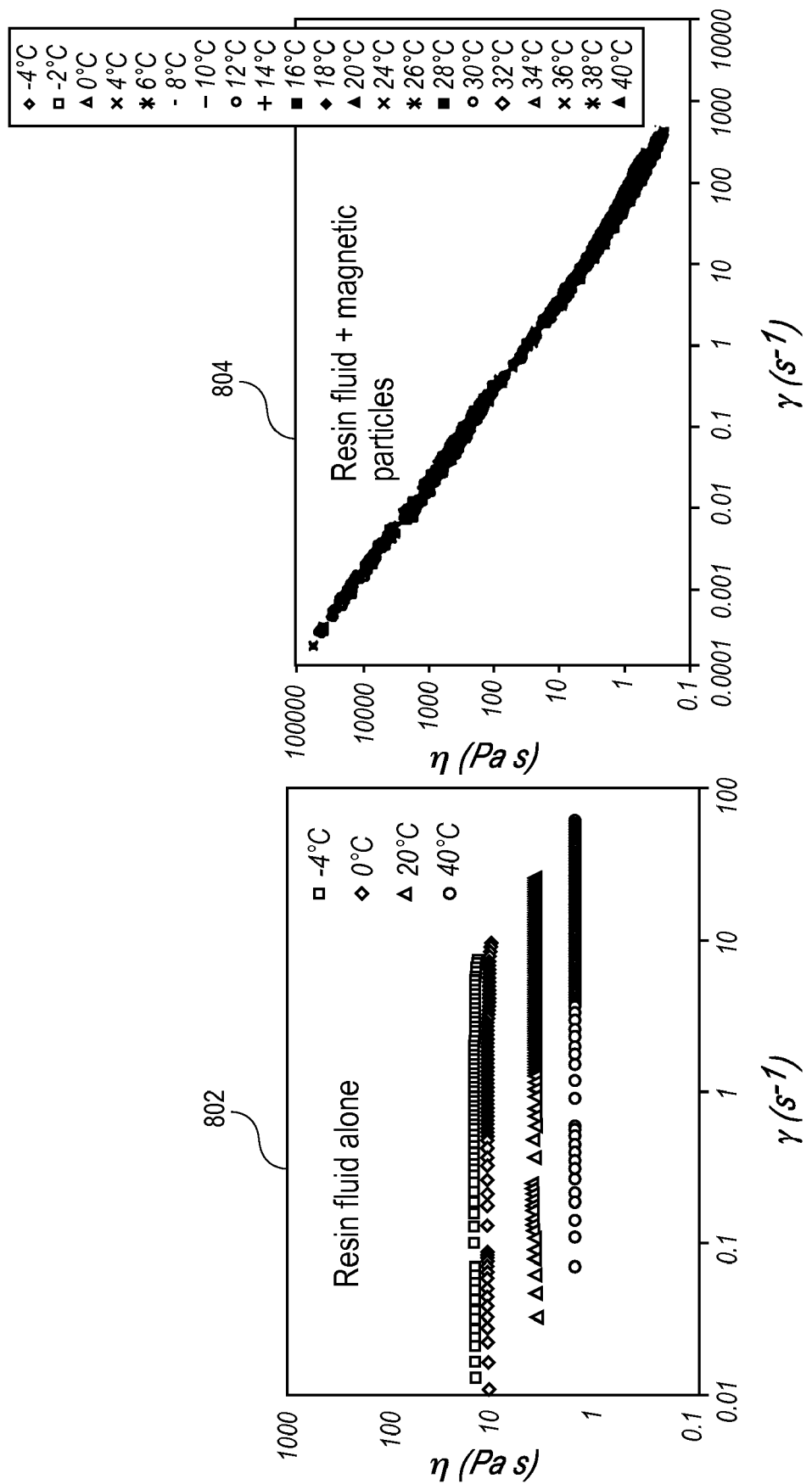
FIG. 8 includes plots showing the temperature correlation of viscosity for a resin fluid alone and a resin fluid including magnetic particles, in accordance with an embodiment of the present invention.

In another embodiment of the present invention, a layer of magnetic particle-based composite material is incorporated into a semiconductor package without the use of an externally applied magnetic field. In accordance with an embodiment of the present invention, in the absence of an external magnetic field being applied during processing, a layer of magnetic particle-based composite material is a composite system held together by strong magnetic attractions provided by the magnetic particles. Magnetic forces are temperature independent (limited only by the Curie temperature of the magnetic particle, which is typically >500° C., beyond which the particle loses its magnetization and undergoes the ferromagnetic to paramagnetic phase transition) and long-range (unlike Brownian motion and hydrodynamic forces, which are relatively short range). In one embodiment, magnetic forces impart substantial visco-elasticity and non-Newtonian behavior (both of which are temperature independent) to a layer of magnetic particle-based composite material. In an embodiment, the visco-elasticity and non-Newtonian behavior cause the layer of magnetic particle-based composite material to exhibit extremely shear thinning dominated with substantial viscosity. FIG. 8 includes plots 802 and 804 showing the temperature correlation of viscosity for a resin fluid alone and a resin fluid including magnetic particles, respectively, in accordance with an embodiment of the present invention. Referring to plot 802, the resin fluid (polymer matrix) without magnetic particles has a viscosity, η, that varies with temperature. However, referring to plot 804, the resin fluid including magnetic particles has a viscosity, η, that is temperature independent. In accordance with an embodiment of the present invention, the temperature independence of the viscosity of a layer of magnetic particle-based composite material is exploited to substantially reduce polymer shrinkage which could otherwise occur as a result of thermal cycling within a semiconductor package.

Figure 9:
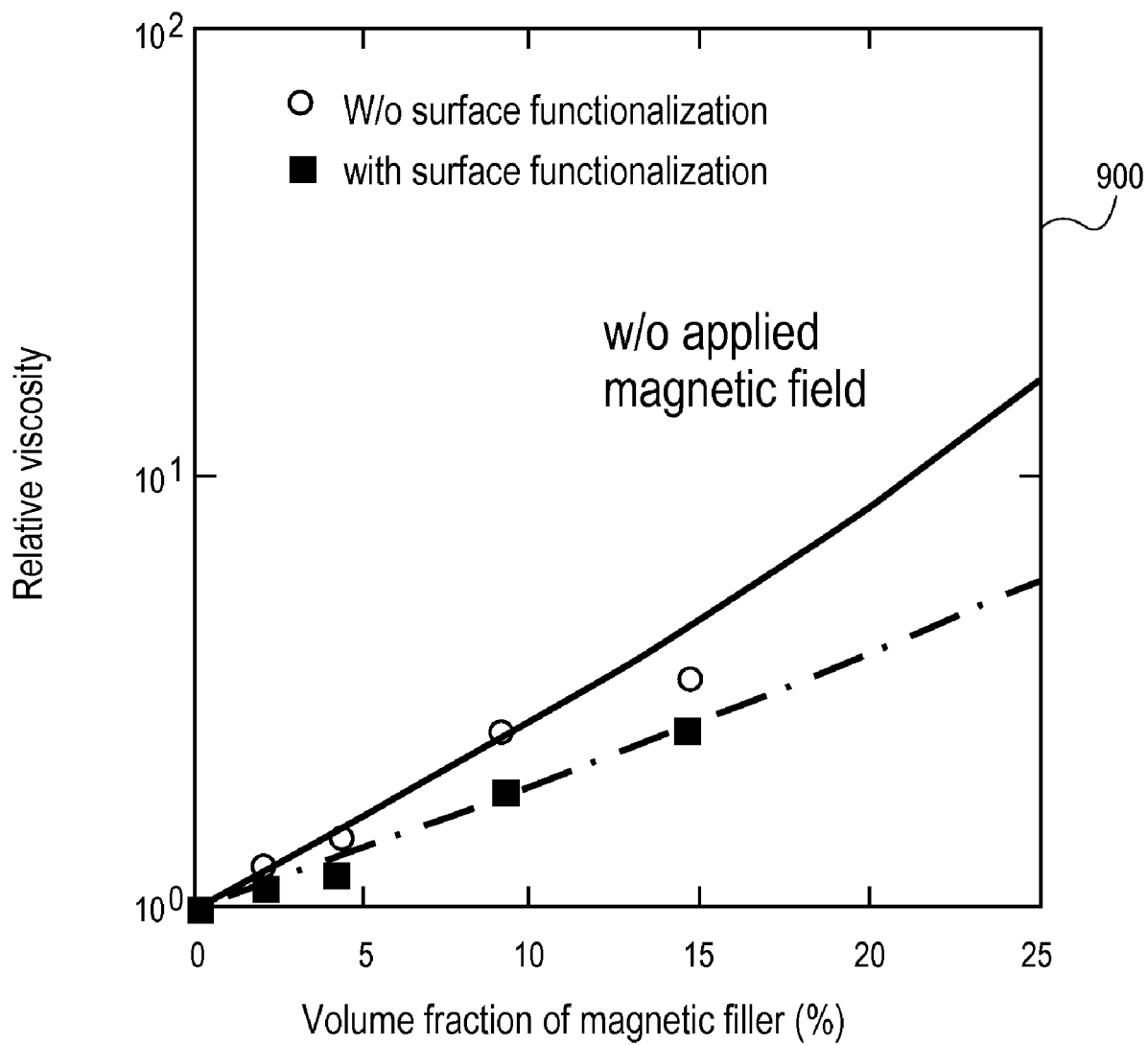
FIG. 9 is a plot showing the relative viscosity of two types of magnetic particle-based composite materials as a function of percent volume fraction of magnetic particle filler, in accordance with an embodiment of the present invention.

In addition to the temperature independence of viscosity for a layer of magnetic particle-based composite material, in accordance with an embodiment of the present invention, composite materials including magnetic particles having an appropriate surface functionalizing agent exhibit reduced viscosity compared to composite materials including magnetic particles which are not surface-functionalized. Thus, in one embodiment, the viscosity of a layer of magnetic particle-based composite material is reduced during processing. FIG. 9 is a plot 900 showing the relative viscosity of two types of magnetic particle-based composite materials as a function of percent volume fraction of magnetic particle filler, in accordance with an embodiment of the present invention. Referring to plot 900, the viscosity of a magnetic particle-based composite material including surface-functionalized magnetic particles is lower than the viscosity of a magnetic particle-based composite material including magnetic particles that have not been surface-functionalized. In one embodiment, the reduced viscosity effect becomes more apparent when a higher volume fraction of the magnetic filler material (e.g., ~20%) is included in the composite material. In an embodiment, the surface-functionalization dependence of the viscosity of a layer of magnetic particle-based composite material is exploited to aid with interface filling of otherwise difficult to fill locations within a semiconductor package.

Thus, semiconductor packages have been disclosed. In an embodiment, a semiconductor package includes a substrate and an integrated heat spreader disposed above and coupled with the substrate. A cavity is disposed between the substrate and the integrated heat spreader, and a semiconductor die is disposed above the substrate and in the cavity. An array of first-level solder joints is disposed between the substrate and the semiconductor die, in the cavity. A layer of magnetic particle-based composite material is also disposed in the cavity. In another embodiment, a method of fabricating a semiconductor package includes flowing a magnetic particle-based composite material to form a layer of magnetic particle-based composite material along a surface of a semiconductor die housed in the semiconductor package. In another embodiment, a method of fabricating a semiconductor package includes curing a layer of magnetic particle-based composite material by applying an external AC magnetic field to the magnetic particle-based composite material.

What is claimed is:

1. A method for fabricating a semiconductor package, comprising:
   forming an array of first-level solder joints and a semiconductor die on a substrate, wherein said semiconductor die has a top surface and a bottom surface, and wherein said bottom surface is adjacent to said array of first-level solder joints and a top surface;
   forming an integrated heat spreader above said top surface of said semiconductor die and coupled with said substrate; and
   flowing a magnetic particle-based composite material to form a layer of magnetic particle-based composite material along a surface of said semiconductor die, wherein flowing said magnetic particle-based composite material comprises applying, to said magnetic particle-based composite material, an external direct current (DC) magnetic field.

2. The method of claim 1, wherein flowing said magnetic particle-based composite material comprises forming said layer of magnetic particle-based composite material along said bottom surface of said semiconductor die to encapsulate said array of first-level solder joints.

3. The method of claim 1, wherein flowing said magnetic particle-based composite material comprises forming said layer of magnetic particle-based composite material along said top surface of said semiconductor die to bond said semiconductor die with said integrated heat spreader.

4. The method of claim 1, wherein flowing said magnetic particle-based composite material comprises using a polymeric matrix with an array of magnetic particles dispersed therein.

5. The method of claim 4, wherein using said polymeric matrix further comprises using an array of non-magnetic particles, and wherein the ratio of said array of magnetic particles to said array of non-magnetic particles is approximately 1:9.

6. The method of claim 4, wherein using said array of magnetic particles includes using metal particles selected from the group consisting of iron (Fe), Cobalt (Co), Nickel (Ni), and alloys thereof.

7. The method of claim 4, wherein using said array of magnetic particles includes using metal oxide particles of a formula selected from the group consisting of $MFe_2O_4$ and $MFe_{12}O_{19}$, where M is a metal selected from the group consisting of iron (Fe), Cobalt (Co), and Nickel (Ni).

8. The method of claim 1, further comprising:
   curing said layer of magnetic particle-based composite material by applying, to said magnetic particle-based composite material, an external alternating current (AC)

magnetic field with a frequency, $R_F$, approximately in the range of 100-1000 kHz.

9. A method for fabricating a semiconductor package, comprising:

forming an array of first-level solder joints and a semiconductor die on a substrate, wherein said semiconductor die has a top surface and a bottom surface, and wherein said bottom surface is adjacent to said array of first-level solder joints;

disposing an integrated heat spreader above said top surface of said semiconductor die and coupled with said substrate;

forming a layer of magnetic particle-based composite material along a surface of said semiconductor die; and curing said layer of magnetic particle-based composite material by applying, to said magnetic particle-based composite material, an external alternating current (AC) magnetic field.

10. The method of claim 9, wherein applying said external alternating current (AC) magnetic field comprises applying an AC magnetic field with a frequency, $R_F$, approximately in the range of 100-1000 kHz.

11. The method of claim 10, wherein the curing further comprises applying, to said magnetic particle-based composite material, an external direct current (DC) magnetic field having a field strength of less than approximately 1 Tesla, and wherein said layer of magnetic particle-based composite material is a low modulus film following the curing.

12. The method of claim 10, wherein the curing further comprises applying, to said magnetic particle-based composite material, an external direct current (DC) magnetic field having a field strength of greater than approximately 1 Tesla, and wherein said layer of magnetic particle-based composite material is a high modulus film following the curing.

13. A method for fabricating a semiconductor package, comprising:

forming an array of first-level solder joints and a semiconductor die on a substrate, wherein said semiconductor die has a top surface and a bottom surface, and wherein said bottom surface is adjacent to said array of first-level solder joints and a top surface;

forming an integrated heat spreader above said top surface of said semiconductor die and coupled with said substrate;

flowing a magnetic particle-based composite material to form a layer of magnetic particle-based composite material along a surface of said semiconductor die; and curing said layer of magnetic particle-based composite material by applying, to said magnetic particle-based composite material, an external alternating current (AC) magnetic field with a frequency, $R_F$, approximately in the range of 100-1000 kHz.

14. The method of claim 13, wherein flowing said magnetic particle-based composite material comprises forming said layer of magnetic particle-based composite material along said bottom surface of said semiconductor die to encapsulate said array of first-level solder joints.

15. The method of claim 13, wherein flowing said magnetic particle-based composite material comprises forming said layer of magnetic particle-based composite material along said top surface of said semiconductor die to bond said semiconductor die with said integrated heat spreader.

16. The method of claim 13, wherein flowing said magnetic particle-based composite material comprises using a polymeric matrix with an array of magnetic particles dispersed therein.

17. The method of claim 16, wherein using said polymeric matrix further comprises using an array of non-magnetic particles, and wherein the ratio of said array of magnetic particles to said array of non-magnetic particles is approximately 1:9.

18. The method of claim 16, wherein using said array of magnetic particles includes using metal particles selected from the group consisting of iron (Fe), Cobalt (Co), Nickel (Ni), and alloys thereof.

19. The method of claim 16, wherein using said array of magnetic particles includes using metal oxide particles of a formula selected from the group consisting of $MFe_2O_4$ and $MFe_{12}O_{19}$, where M is a metal selected from the group consisting of iron (Fe), Cobalt (Co), and Nickel (Ni).

20. The method of claim 13, wherein applying said external alternating current (AC) magnetic field comprises applying an AC magnetic field with a frequency, $R_F$, approximately in the range of 100-1000 kHz.

* * * * *